US006274886B1

United States Patent
Sasaki et al.

(10) Patent No.: US 6,274,886 B1
(45) Date of Patent: Aug. 14, 2001

(54) THIN-FILM-TRANSISTOR-ARRAY SUBSTRATE AND LIQUID-CRYSTAL DISPLAY DEVICE

(75) Inventors: Makoto Sasaki; Hitoshi Kitagawa, both of Miyagi-ken (JP)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/385,391

(22) Filed: Aug. 30, 1999

(30) Foreign Application Priority Data

Aug. 31, 1998 (JP) .................................................. 10-246336

(51) Int. Cl.[7] .................................................. H01L 29/00
(52) U.S. Cl. .............................. 257/72; 257/59; 257/336; 257/347; 349/42; 349/43
(58) Field of Search .............................. 257/72, 336, 347, 257/59; 349/42, 43

(56) References Cited

U.S. PATENT DOCUMENTS 5,424,857 * 6/1995 Aoki et al. .............................. 359/59
5,793,460 8/1998 Yang .

FOREIGN PATENT DOCUMENTS 1-069458 * 1/2001 (EP) .

* cited by examiner

Primary Examiner—Nathan Flynn
Assistant Examiner—Ahmed Sefer
(74) Attorney, Agent, or Firm—Brinks Hofer Gilson & Lione

(57) ABSTRACT

In a thin-film-transistor-array substrate, a plurality of gate wires and a plurality of source wires are provided on the substrate to form a matrix; a pixel is formed on each of a plurality of areas each enclosed by two adjacent ones of the gate wires and two adjacent ones of the source wires; the pixel includes a thin-film-transistor having: a gate electrode formed as a portion of the gate wire; a source electrode formed as a portion of the source wire; and a drain electrode connected to a pixel electrode formed on an insulation layer covering the gate electrode, the gate wire, the source electrode and the source wire through a contact hole formed by boring the insulation layer, and a dummy hole is formed by boring a portion of the insulation film above at least one of the gate electrode, the gate wire, the source electrode and the source wire in close proximity to the contact hole with the dummy hole reaching the gate electrode, the gate wire, the source electrode or the source wire respectively.

2 Claims, 6 Drawing Sheets

THIN-FILM-TRANSISTOR-ARRAY SUBSTRATE AND LIQUID-CRYSTAL DISPLAY DEVICE

BACKGROUND OF THE INVENTION

1. Field of the invention

The present invention relates to a thin-film-transistor (abbreviated hereafter to TFT)-array substrate and a liquid-crystal display device. More particularly, the present invention relates to the structure of a TFT-array substrate capable of solving a problem that arises when a contact hole of a TFT is formed by boring a film using a dry-etching technology.

2. Description of the Related Art

FIG. 7 is a diagram showing one of a pair of substrates sandwiching a liquid crystal in a conventional ordinary TFT liquid-crystal display device. To be more specific, FIG. 7 shows a typical structure of a TFT-array substrate including inverted-stagger TFTs, gate wires and source wires. As shown in the figure, in the TFT-array substrate 60, the gate wires 50 and the source wires 51 are provided to form a matrix on a transparent substrate. A square area enclosed by two parallel adjacent gate wires 50 and two parallel adjacent source wires 51 serves as a pixel 52 on which a TFT 53 is provided.

As shown in the figure, on the TFT 53, there is provided a gate electrode 54 protruding out off a gate wire 50. A gate insulation film covers the entire surface of the gate electrode 54. A semiconductor active film 55 is provided on the gate insulation film above the gate electrode 54. A drain electrode 57 and a source electrode 56 are provided over a space spread over the top surface of the gate insulation film to the top surface of the semiconductor active film 55. The source electrode 56 protrudes out off the source wire 51. A passivation film is provided to cover the TFT 53 comprising the source electrode 56, the drain electrode 57 and the gate electrode 54. A contact hole 58 is formed by boring the passivation film on the drain electrode 57. There is also provided a pixel electrode 59 made of a transparent conductive film. The pixel electrode 59 is electrically connected to the drain electrode 57 trough the contact hole 58.

FIG. 7 shows a top view of the leftmost top pixel of the TFT matrix unit on the TFT-array substrate 60. The end of each gate wire 50 is extended to the outside of the TFT matrix unit or to the left side on the figure. At the end of the extension, a gate terminal pad 61 is provided for connecting the gate wire 50 to a gate driver for driving the gate wire 50. It should be noted that the gate driver itself is not shown in the figure. Each source wire 51 is configured in the same way as the gate wire 50 except that the end of the source wire 51 is extended to the outside of the TFT matrix unit or in the upward direction on the figure. At the end of the extension, a source terminal pad 62 is provided for connecting the source wire 51 to a source driver (not shown) for supplying a signal to the source wire 51. At the locations of the gate terminal pad 61 and the source terminal pad 62, lower pad layers are provided. The lower pad layers are each a wiring layer created to form a single body with the gate wire 50 or the source wire 51. A contact hole is formed by boring the passivation film covering the each of the lower pad layer so that the lower pad layer is exposed to any upper layer created thereon. An upper pad layer electrically connected to the lower pad layer through the contact hole is normally provided.

As described above, on the TFT-array substrate, there are provided a contact hole for electrically connecting the drain electrode of the TFT to the pixel electrode, and a contact hole for electrically connecting each lower pad layer and an upper pad layer at the locations of the gate terminal pad and the source terminal pad. Normally, these contact holes are formed by boring the passivation films by using the dry-etching technique during a process to fabricate the TFT-array gate. Specifically, the contact hole at the location of the gate terminal pad is formed by boring both the gate insulation film and the passivation film by applying the dry-etching technique.

In general, when the dry-etching technique is applied using an etching apparatus, however, there is observed a phenomenon wherein a substrate being processed is electrically charged because the substrate is exposed to a plasma generated in a chamber of the etching apparatus. In addition, the electric charge is not spread uniformly over the whole surface of the substrate being processed for a variety of reasons, resulting in a distribution of electrical charge on the surface.

Thus, also in a dry-etching process to form the contact holes described above, the drain electrode exposed during the formation of the contact holes or the lower pad layers beneath the gate and source terminal pads are electrically charged. As a result, the gate and source wires are electrically charged. In the case of the contact hole on the drain electrode, the contact hole on the gate terminal pad and the contact hole on the source terminal pad, the locations of the holes are separated from each other. Thus, there are differences in electric-charge amount between the drain electrode and the gate and source wires due to an effect of the electric-charge distribution on the surface created by the plasma, generating differences in electric potential between them. Even though FIG. 7 shows only one pixel, in actuality, there are a number of pixels on the TFT-array substrate, and the drain electrodes of TFTs on the pixels have different amounts of electric charge due to the distribution of electric charge on the surface.

In such a state, in spite of the fact that no voltage is applied during an operation to drive the TFT-array substrate, a difference in electric potential has already been generated between the drain electrode and the source electrode of each TFT at a stage the TFT-array substrate is completed. In addition, the difference in electric potential generated between the drain electrode and the source electrode varies from TFT to TFT on the TFT-array substrate, raising a problem that surface variations in characteristics among the TFTs on the TFT-array substrate increase in magnitude and number.

Moreover, the difference in electric-charge amount between the gate terminal pad and the source terminal pad results in a difference in electric potential between the gate wire and the source wire at locations sandwiching the gate insulation film. In the case of a large difference in electric potential between the gate wire and the source wire, it is feared that the insulation of the gate insulation film at a location of an intersection of the gate and source wires is broken.

Normally, in order to eliminate adverse effects of electric charge generated by a plasma during a dry-etching process on characteristics of a TFT, an anneal treatment is introduced in any process following the dry-etching process as a countermeasure. It is desirable, however, to provide a TFT-array substrate which can be produced by eliminating adverse effects caused inherently electric charge generated by a plasma without carrying out an anneal treatment as an additional process. In addition, there is also raised a problem caused by the fact. that, the larger the size of the substrate, the greater the variations of electric charge generated by the plasma on the surface. It is thus desirable to provide a proper solution to this problem.

SUMMARY OF THE INVENTION

It is thus an object of the present embodiment addressing the problems described above to provide a TFT-array substrate having a structure capable of avoiding variations in characteristics among TFTs caused by electric charge generated by a plasma during a dry-etching process as well as preventing insulation of a gate insulation film from being broken, and to provide a liquid-crystal display device exhibiting a uniform picture quality and excellent reliability.

In order to achieve the object described above, the present invention provides a TFT-array substrate wherein: a plurality of gate wires and a plurality of source wires are provided on said substrate to form a matrix; a pixel is formed on each of a plurality of areas each enclosed by two adjacent ones of said gate wires and two adjacent ones of said source wires; said pixel includes a TFT having: a gate electrode formed as a portion of said gate wire associated with said pixel; a source electrode formed as a portion of said source wire associated with said pixel; and a drain electrode connected to a pixel electrode formed on an insulation layer covering said gate electrode, said gate wire, said source electrode and said source wire through a contact hole formed by boring said insulation layer, and a dummy hole is formed by boring a portion of said insulation film above at least one of said gate electrode, said gate wire, said source electrode and said source wire in close proximity to said contact hole with said dummy hole reaching said gate electrode, said gate wire, said source electrode or said source wire, respectively.

As described, the locations of the contact hole on the drain electrode, the contact hole on the gate terminal pad and the contact hole on the source terminal pad in the structure of the conventional ordinary TFT-array substrate are separated from each other so that the amounts of electric charge in the drain electrode, the gate wire and the source wire are different from each other, resulting in differences in electric potential among the drain electrode, the gate wire and the source wire. In order to solve this problem, on the TFT-array substrate provided by the present invention, a dummy hole is formed by boring a portion of an insulation film above at least one of a gate electrode, a gate wire, a source electrode and a source wire in close proximity to a contact hole on the drain electrode with the dummy hole reaching the gate electrode, the gate wire, the source electrode and the source wire, respectively. In this structure, the position of the contact hole on the drain electrode is close enough to the position of the dummy hole so that, when these holes are formed by using the dry-etching technique at the same time, the amounts of electric charge in the drain electrode, the gate electrode and the source electrode which are exposed beneath the holes during the dry-etching process are all but equal to each other, resulting in no difference in electric potential. The dummy hole does not play any role in the TFT as its name suggests. The dummy hole is no more than a hole for making the amounts of electric charge in the drain electrode, the gate electrode and the source electrode almost equal to each other.

The dummy hole can also be formed above the gate electrode or above the gate wire of the TFT as long as the position of the dummy hole is close to the contact hole above the drain electrode in the TFT. In addition, the dummy hole can also be formed above the source electrode or above the source wire. Note, however, that it is not desirable to change the design by for example extending a wire in order to reserve a space for forming the dummy hole. It is therefore desirable to have a design wherein a dummy hole is formed above an electrode or a wire in the conventional layout.

Thus, if a dummy hole is formed in a TFT above either the source electrode or the source wire of the TFT, almost no difference in electric potential between the source electrode and the drain electrode in the TFT is generated so that it is possible to suppress variations in characteristics among a number of TFTs on the TFT-array substrate to small values. In addition, if a dummy hole is formed in a TFT above either the gate electrode or the gate wire of the TFT, no difference in electric potential is generated in the gate insulation film sandwiched by the source electrode and the drain electrode of the TFT so that it is possible to suppress variations in characteristics among a number of TFTs on the TFT-array substrate to small values. Moreover, if a dummy hole is formed in a TFT above either the source electrode or the source wire of the TFT and another dummy hole is formed above either the gate electrode or the gate wire of the TFT, almost no difference in electric potential is generated at the position of an intersection of the source and gate wires so that it is possible to make the insulation of the gate insulation film difficult to break. According to the TFT-array substrate provided by the present invention, the problems of the conventional TFT-array substrate can be solved. The present invention is also applicable to a TFT-array substrate with a large size. As has been generally known for a long time, in order to eliminate adverse effects of electric charge generated by a plasma during a dry-etching process on characteristics of a TFT, an anneal treatment is introduced in any process following the dry-etching process as a countermeasure. However, the structure of the TFT-array substrate provided by the present invention can be formed with ease by merely adding a pattern of dummy holes to a photo mask used for forming contact holes. It is thus possible to eliminate adverse effects of electric charge generated by a plasma during a dry-etching process on characteristics of a TFT without an anneal treatment.

A liquid-crystal display device provided by the present invention comprises a liquid crystal sandwiched by a pair of substrates facing each other wherein one of the two substrates is the TFT-array substrate described above.

Since the liquid-crystal display device provided by the present invention employs a TFT-array substrate with small variations in characteristics among TFTs thereof and a gate insulation layer of each TFT having difficult-to-break insulation, it is possible to provide a liquid-crystal display device exhibiting a uniform picture quality and excellent reliability.

BRIEF DESCRIPTION OF THE DRAWINGS

FIG. 4 is diagrams showing the structure of a liquid-crystal display device provided by the embodiment, in which

DESCRIPTION OF THE PREFERRED EMBODIMENT

A preferred embodiment is described by referring to FIGS. 1 to 6.

An embodiment providing a TFT liquid-crystal display device has a structure comprising two glass substrates facing each other and a liquid crystal sealed in a gap sandwiched by the two substrates. On one of the glass substrates, a transparent common electrode is formed. On the other glass substrate, on the other hand, a plurality of transparent pixel electrodes and the same plurality of TFTs are formed to form a matrix in addition to the same plurality of circuits each used for applying a voltage to one of the pixel electrode.

Figure 1:
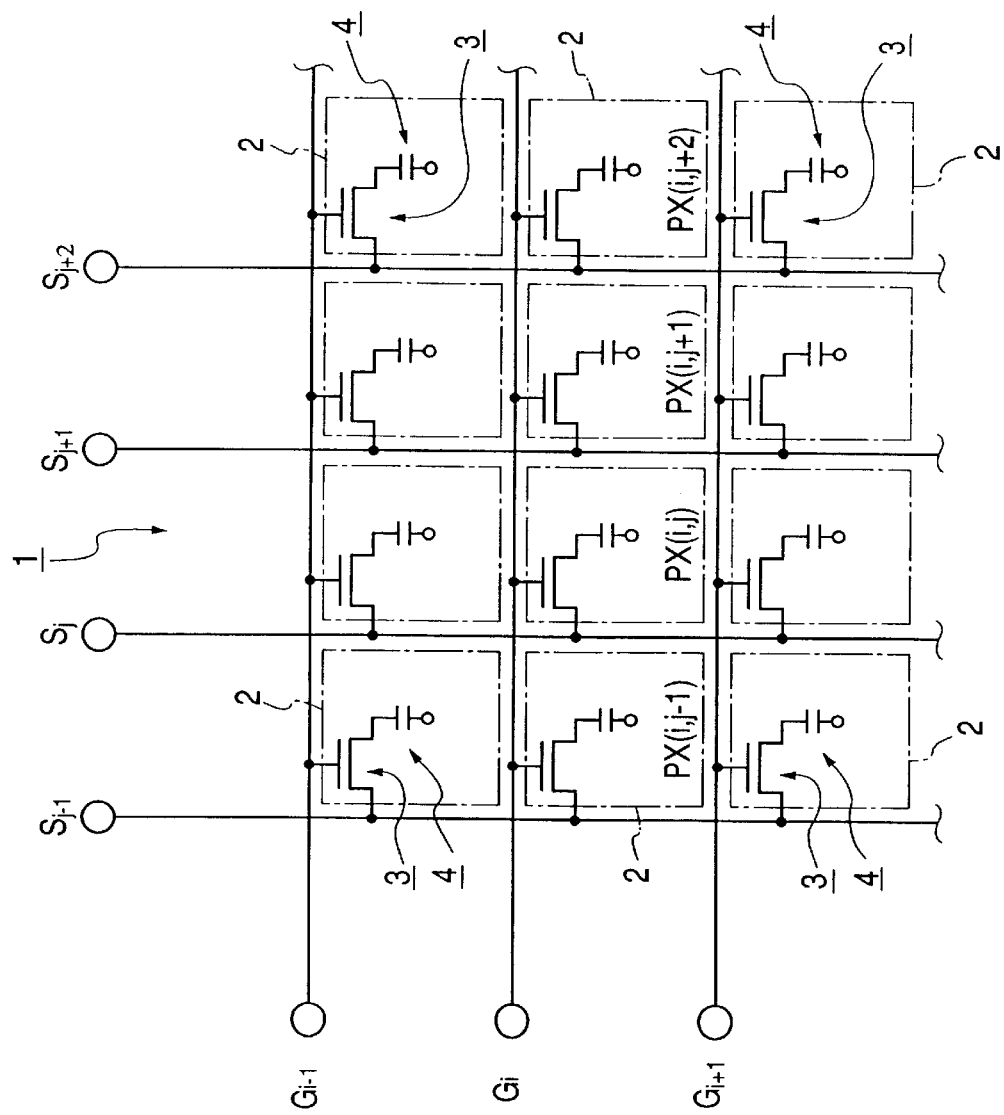
FIG. 1 is a diagram showing an equivalent circuit of a TFT-array substrate implemented by an embodiment of the present invention.

FIG. 1 is a diagram showing an equivalent circuit of a TFT-array substrate. The TFT-array substrate is one of the glass substrates of the TFT liquid-crystal display device provided by the embodiment, on which the pixel electrodes are formed.

This TFT-array substrate 1 has a TFT matrix unit comprising m rows and n columns of pixels PX (i, j) where i=1 to m and j=1 to n. FIG. 1 shows a portion of the TFT-array substrate 1. Single-dotted-line rectangles laid out horizontally and vertically in the figure each represent a pixel 2.

As shown in the figure, the pixels 2 are laid out regularly in the horizontal (column) direction and the vertical (row direction). n source lines Sj where j=1 to n are each provided for pixels 2 on a column and m gate lines Gi where i=1 to m are each provided for pixels 2 on a row. The source lines Sj where j=1 to n supply signal voltages to pixels PX (i, j) where i=1 to m, and j=1 to n, respectively. On the other hand, the gate lines Gi where i=1 to m supply gate voltages for writing signal voltages to pixels PX (i, j) where i=1 to m and j=1 to n, respectively.

The pixels PX (i, j) each have a pixel electrode and a TFT 3 described above. In the TFT 3, a source electrode and a gate electrode are connected to the source line Sj and the gate line Gi respectively whereas a drain electrode is connected to the pixel electrode. A liquid crystal is sandwiched between the pixel electrode and the common electrode formed on the other glass substrate as described above. A capacitor 4 shown in FIG. 1 is a liquid-crystal capacitor sandwiched by the pixel electrode and the common electrode. The TFT 3 functions as a switching device turned on to write data or turned off to write no data into the pixel 2, that is, for passing on or blocking on a signal voltage supplied by the source line Sj to the liquid-crystal capacitor 4.

Figure 2:
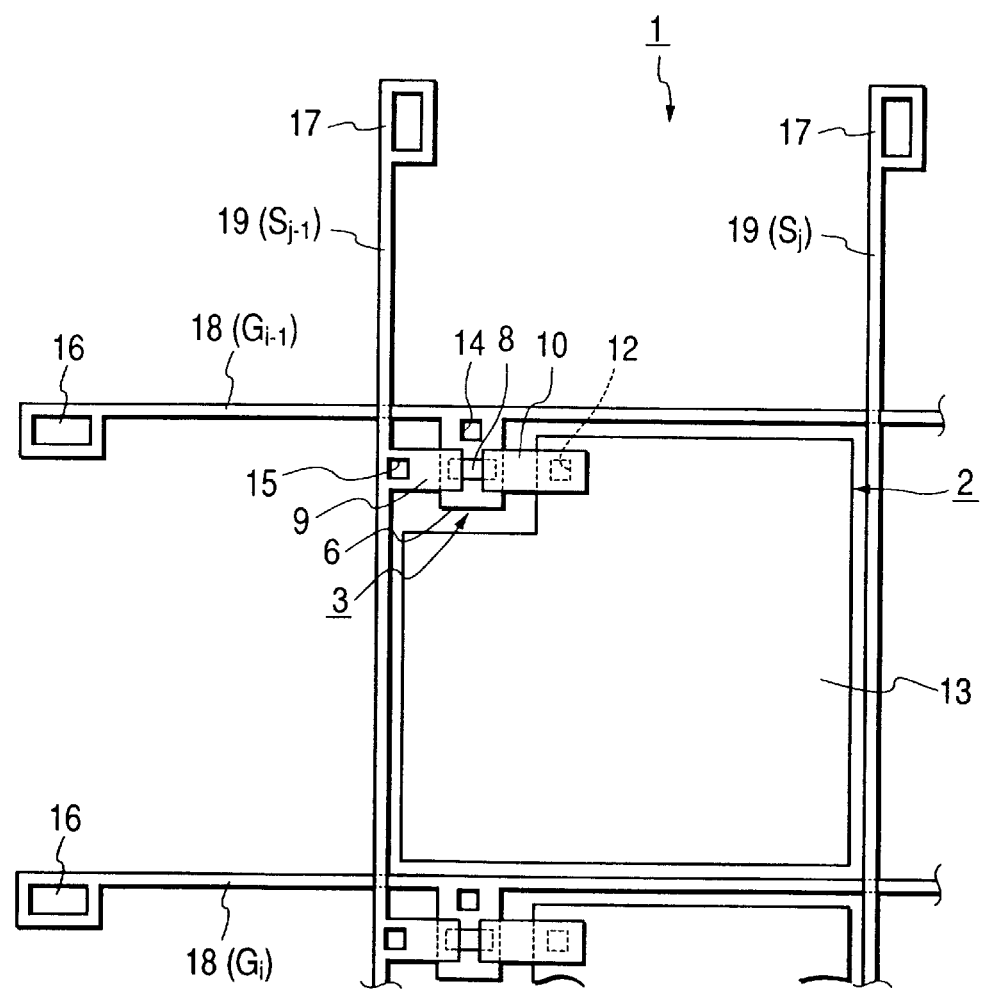
FIG. 2 is an enlarged diagram showing a top view of a layout of main components employed in the TFT-array substrate shown in FIG. 1.

FIG. 2 is an enlarged diagram showing the leftmost top pixel PX (i-1, j-1) denoted by reference numeral 2 in FIG. 1 on the TFT-array substrate 1 shown in FIG. 1. FIG. 3 is a diagram showing a process flow representing a procedure for fabricating the TFT-array substrate 1. The symbol a shown in FIG. 3 denotes a cross-sectional structure of a portion serving as a TFT and the symbol b denotes a cross-sectional structure of a portion serving as a source terminal pad. The symbol c denotes a cross-sectional structure of a portion serving as a gate terminal pad.

Figure 3A:
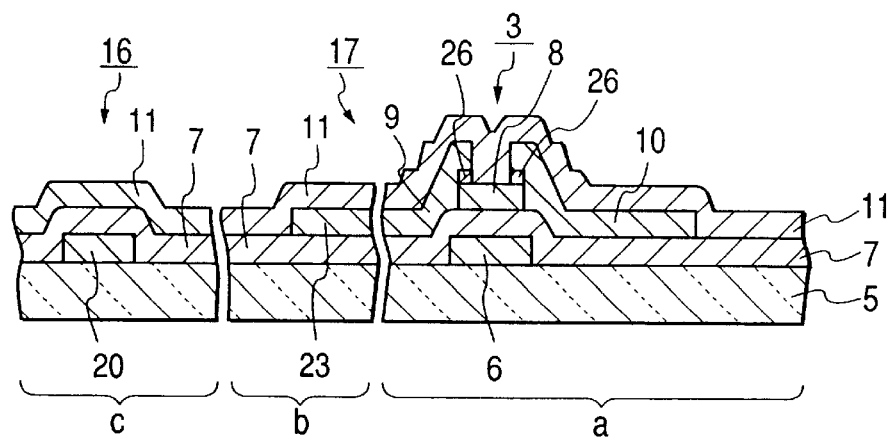
FIGS. 3A to 3C are diagrams showing a process flow representing a procedure for fabricating the TFT-array substrate shown in FIG. 1.
Figure 3B:
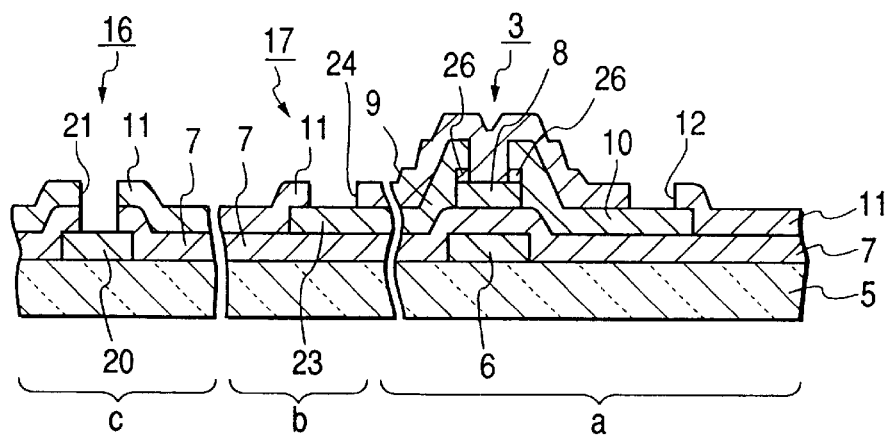
Figure 3C:
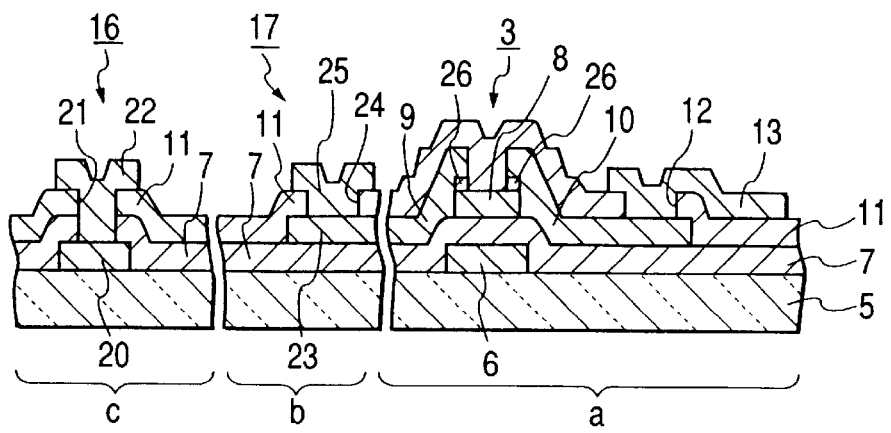

As shown in FIGS. 2 and 3C, a TFT 3 is formed as a transistor of the inverted-stagger type and a gate electrode 6 is formed on the transparent substrate 5 to protrude out off a gate wire 18. A gate insulation film 7 is provided to cover the gate electrode 6. On the gate insulation film 7 above the gate electrode 6, a semiconductor active film 8 made of amorphous silicon is provided. A drain electrode 10 and a source electrode 9 are provided over a space spread over the top surface of the gate insulation film 7 to the top surface of the semiconductor active film 8. The source electrode 9 protrudes out off the source wire 19. A passivation film 11 is provided to cover the TFT 3 comprising the source electrode 9, the drain electrode 10 and the gate electrode 6. A contact hole 12 is formed by boring the passivation film 11 on the drain electrode 10. There is also provided a pixel electrode 13 made of ITO (Indium Tin Oxide). The pixel electrode 13 is electrically connected to the drain electrode 10 through the contact hole 12. It should be noted that the wiring layers such as the gate wire 18, the gate electrode 6, the source wire 19, the source electrode 9 and the drain electrode 10 are made of a metal such as the aluminum.

In addition, for each TFT 3 in this embodiment, a dummy hole 14 is provided at a position on the gate electrode 6 close to the gate wire 18. Similarly, a dummy hole 15 is provided at a position on the source electrode 9 close to the source wire 19. The dummy hole 14 on the gate electrode 6 is formed by boring the passivation film 11 and the gate insulation film 7 covering the gate electrode 6. The passivation film 11 and the gate insulation film 7 are bored up to the upper surface of the gate electrode 6. Likewise, the dummy hole 15 on the source electrode 9 is formed by boring the passivation film 11 covering the source electrode 9. The passivation film 11 is bored up to the upper surface of the source electrode 9.

As shown in FIG. 2, the end of each gate wire 18 is extended to the outside of the TFT matrix unit or to the left side on the figure. At the end of the extension, a gate terminal pad 16 is provided for connecting the gate wire 18 to a gate driver for driving the gate wire 18. It should be noted that the gate driver itself is not shown in the figure. Each source wire 19 is configured in the same way as the gate wire 18 except that the end of the source wire 19 is extended to the outside of the TFT matrix unit in the upward direction on the figure. At the end of the extension, a source terminal pad 17 is provided for connecting the source wire 19 to a source driver for supplying a signal to the source wire 19. It should be noted that the source driver itself is also not shown in the figure. As shown in FIG. 3C, at the location of the gate terminal pad 16, a lower pad layer 20 is provided. The lower pad layer 20 is a metallic layer created to form a single body with the gate wire 18. A contact hole 21 is formed by boring the passivation film 11 and the gate insulation film 7 covering the lower pad layer 20 so that the gate insulation film 7 and the passivation film 11 are exposed above the pad. An upper pad layer 22 electrically connected to the lower pad layer 20 through the contact hole 21 is provided. The upper pad layer 22 is made of ITO. Similarly, at the location of the source terminal pad 17, a lower pad layer 23 is provided. The lower pad layer 23 is a metallic layer created to form a single body with the source wire 19. A contact hole 24 is formed by boring the passivation film 11 covering the lower pad layer 23 so that the passivation film 11 is exposed above the pad. An upper pad layer 25 made of ITO and electrically connected to the lower pad layer 23 through the contact hole 24 is provided.

Next, a method of fabricating the TFT-array substrate with the structure described above is explained by referring to a process flow shown in FIG. 3.

First of all, a metallic film is formed on a transparent substrate 5 as shown in FIG. 3A. Then, a gate electrode 6 and a gate wire 18 not shown in the figure are formed by patterning. Subsequently, a gate insulation film 7 is formed to cover the gate electrode 6. The gate insulation film 7 is a film made of SiNx. An a-Si film and an a-Si:n+ film are then formed sequentially one after another. Then, by patterning the a-Si film and the a-Si:n+ film altogether, a semiconductor active film 8 is formed in the a-Si film above the gate electrode 6 through the gate insulation film 7.

A metallic film is then formed to cover the entire surface. Then, by patterning the metallic film, a drain electrode 10, a source electrode 9 and a source wire 19 not shown in the figure are formed in the metallic film. Further, by removing the a-Si:n+ film on a channel portion of the semiconductor active film 8, an ohmic contact layer 26 is formed in the a-Si:n+ film. Then, a passivation film 11 is formed over the entire surface.

Subsequently, by patterning the passivation film 11 formed on the entire surface through adoption of photolithography and dry-etching technologies, an opening is formed on the passivation film 11 above the drain electrode 10 to serve as a contact hole 12 for electrically connecting the drain electrode 10 to the pixel electrode 13 as shown in FIG. 3B. At the same time, the passivation film 11 above the lower pad layer 23 at the position of the source terminal pad 17 is bored to form a contact hole 24 for electrically connecting the lower pad layer 23 to an upper pad layer 25 to be formed later. Similarly, the passivation film 11 and the gate insulation film 7 above the lower pad layer 20 at the position of the gate terminal pad 16 are bored to form a contact hole 21 for electrically connecting the lower pad layer 20 to an upper pad layer 22 to be formed later.

Even though not shown in the figure, at that time, a dummy hole 14 is formed by boring the passivation film 11 and the gate insulation film 7 up to the upper surface of the gate electrode 6. Similarly, a dummy hole 15 is formed by boring the passivation film 11 up to the upper surface of the source electrode 9.

Finally, an ITO film is formed over the entire surface as shown in FIG. 3C. Then, by patterning the ITO film, a pixel electrode 13, the upper pad layer 25 above the source terminal pad 17 and the upper pad layer 22 above the gate terminal pad 16 are formed in the ITO film. It should be noted that the ITO film can be left on or removed from the mouths of the dummy holes 14 and 15. At the end of the processes described above, the fabrication of the TFT-array substrate implemented by the embodiment is completed.

Next, the structure of a liquid-crystal display device provided by the embodiment using the TFT-array substrate 1 described above is described.

Figure 4A:
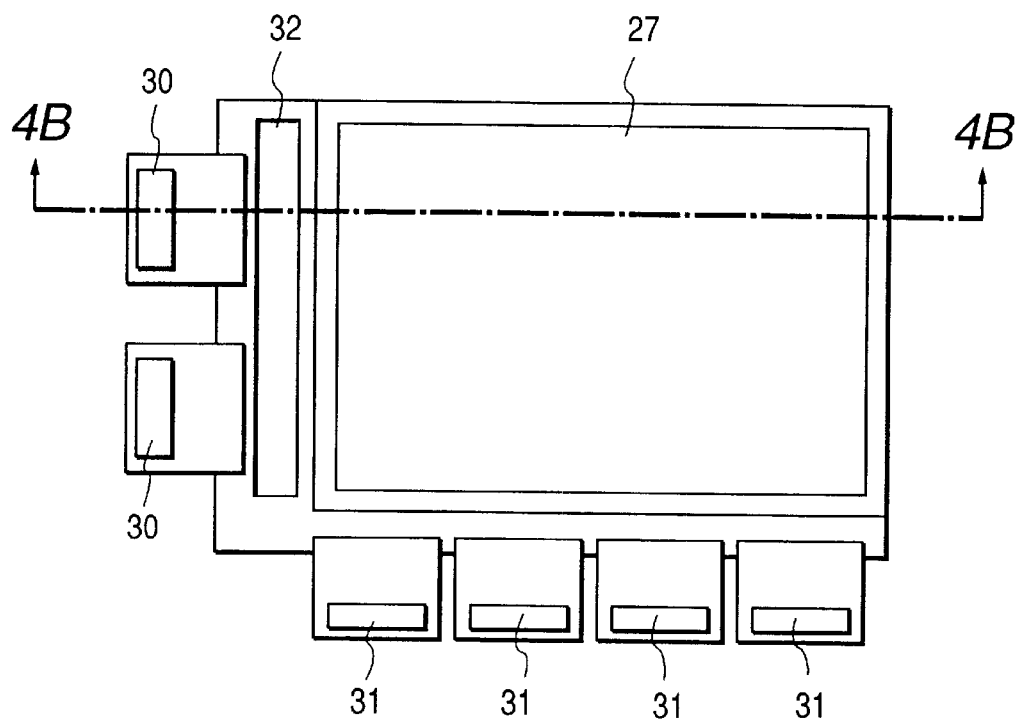
FIG. 4A shows a top view of the liquid-crystal display device and FIG. 4B shows a cross section on a line 4B—4B shown in FIG. 4A.
Figure 4B:
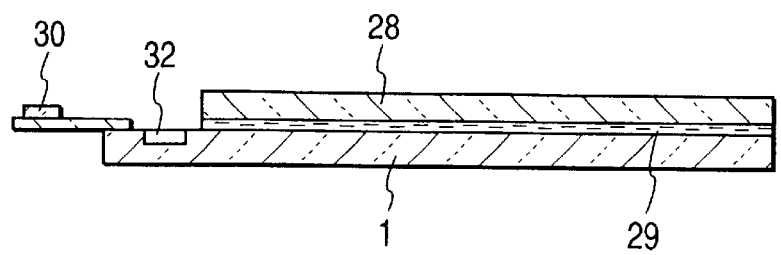

FIGS. 4A and 4B are diagrams showing the structure of the liquid-crystal display device provided by the embodiment. To be more specific, FIG. 4A shows a top view of the liquid-crystal display device and FIG. 4B shows a cross section on a line 4B—4B shown in FIG. 4A. In these figures, reference numeral 1 denotes the TFT-array substrate in the structure. On the TFT-array substrate 1, a TFT matrix unit 27 is formed. The TFT matrix unit 27 includes pixel electrodes 13, TFTs 3, source wires 19 and gate wires 18. It should be noted that the TFT matrix unit 27 has a structure shown in FIGS. 1 and 2. It is thus unnecessary to repeat the explanation of the structure of the TFT matrix unit 27.

Reference numeral 28 denotes a substrate facing the TFT-array substrate 1. The substrate 28 has a common electrode facing each pixel electrode 13 on the TFT-array substrate 1. The common electrode itself is not shown in the figures. The TFT-array substrate 1 and the common-electrode substrate 28 are separated from each other by a gap with a predetermined thickness. A liquid crystal 29 is sealed in the gap. Reference numerals 30 each denote a gate driver and reference numerals 31 each denote a source driver. They are provided with typically 240 output pins.

In the TFT liquid-crystal display device, the TFT matrix unit 27 has typically 960 source lines and 960 gate lines.

Four source drivers 31 are provided on the TFT-array substrate 1 and used for driving the 960 source lines. Naturally, four gate drivers 30 are used for driving the 960 gate lines. In this embodiment, however, the TFT-array substrate 1 is provided with a demultiplexer 32 so that the number of gate drivers 30 can be reduced to two, half the naturally required number.

The outputs of the demultiplexer 32 are connected to the gate wires 30 of the TFTs on the TFT-array substrate 1.

In the TFT-array substrate 1 implemented by the embodiment, dummy holes 14 and 15 are provided above the gate electrode 6 and the source electrode 9 of each TFT 3 respectively. As shown in FIG. 2, the position of the contact hole 12 above the drain electrode 10 is close enough to the positions of the dummy holes 14 and 15 so that, even if the contact hole 12 and the dummy holes 14 and 15 are formed at the same time by using the dry-etching technique, the amounts of electric charge in the drain electrode 10, the gate electrode 6 and the source electrode 9 exposed during the dry-etching process are all but equal to each other, resulting in no differences in electric potential. Thus, since there is almost no difference in electric potential between the source electrode 9 and the drain electrode 10 of the TFT 3, it is possible to suppress variations in characteristics among the TFTs 3 on the TFT-array substrate 1 to small values. In addition, since almost no difference in electric potential is generated at the position of an intersection of the source and gate wires 19 and 18 in close proximity to the TFT 3, it is no longer feared that the insulation of the gate insulation film 7 is broken by the difference in electric potential.

Figure 5:
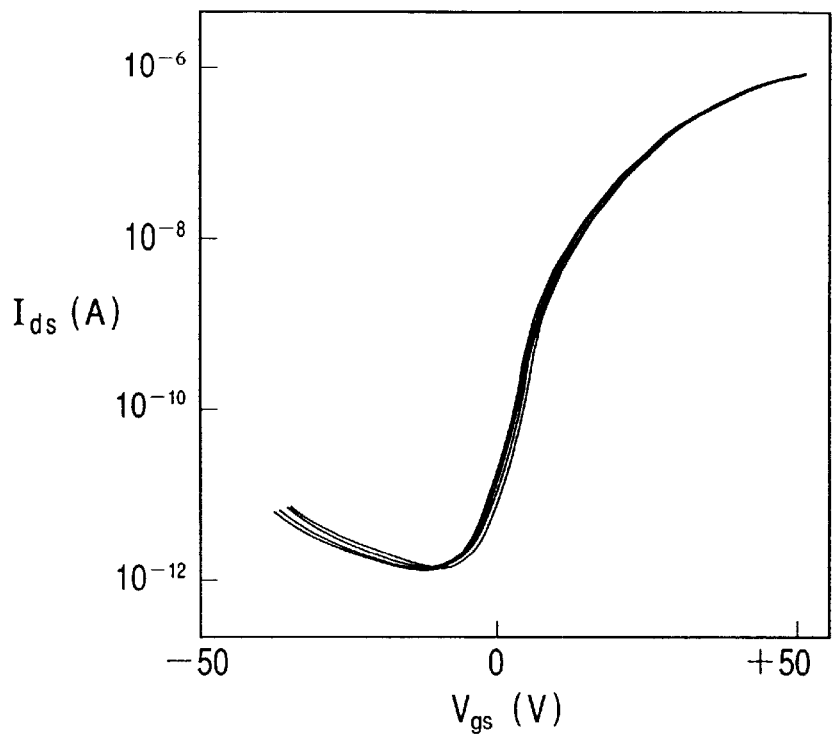
FIG. 5 is a diagram showing surface variations in current-voltage characteristic among TFTs on the TFT-array substrate shown in FIG. 1.

FIG. 5 is a diagram showing surface variations in basic I-V characteristic among the TFTs 3 on the TFT-array substrate 1. An I-V characteristic is a curve representing a relation of a current Ids flowing from the source electrode 9 to the drain electrode 10 of a TFT 3 and a voltage Vgs applied between the source electrode 9 and the gate electrode 6 of the TFT 3.

In FIG. 5, the horizontal and vertical axes respectively represent the voltage Vgs expressed in terms of volts and the current Ids expressed in terms of amperes. As shown in the figure, by adopting the structure of the TFT 3 provided by the embodiment wherein the dummy holes 14 and 15 are formed, the surface variations in I-V characteristic among TFTs 3 on the TFT-array substrate 1 can be suppressed to sufficiently small values since almost no difference in electric potential is generated between the source electrode 9 and the drain electrode 10 by electric charge produced by a plasma during a dry-etching process.

Figure 6:
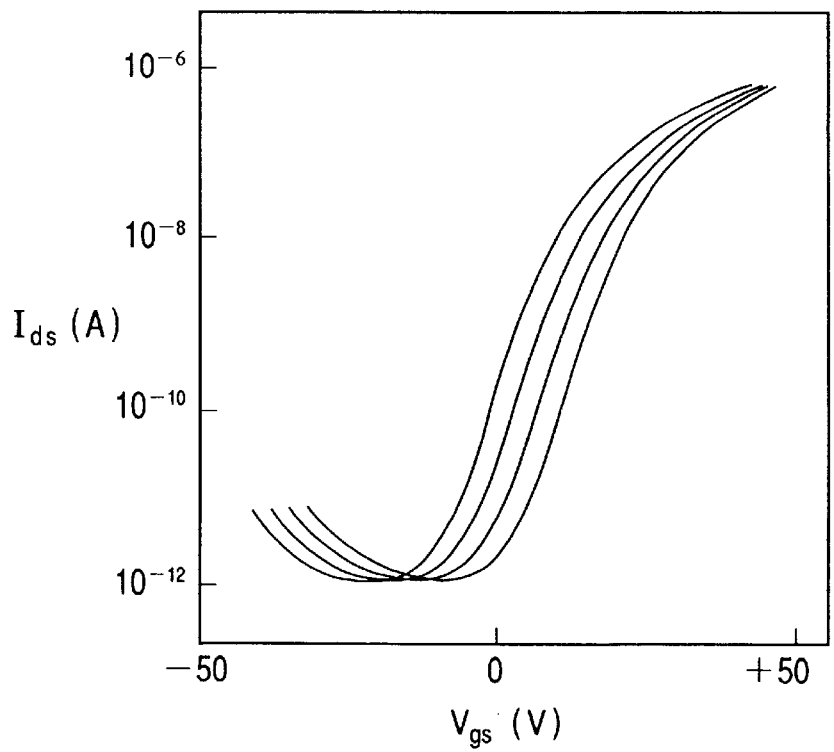
FIG. 6 is a diagram showing surface variations in current-voltage characteristic among TFTs on the conventional TFT-array substrate.
Figure 7:
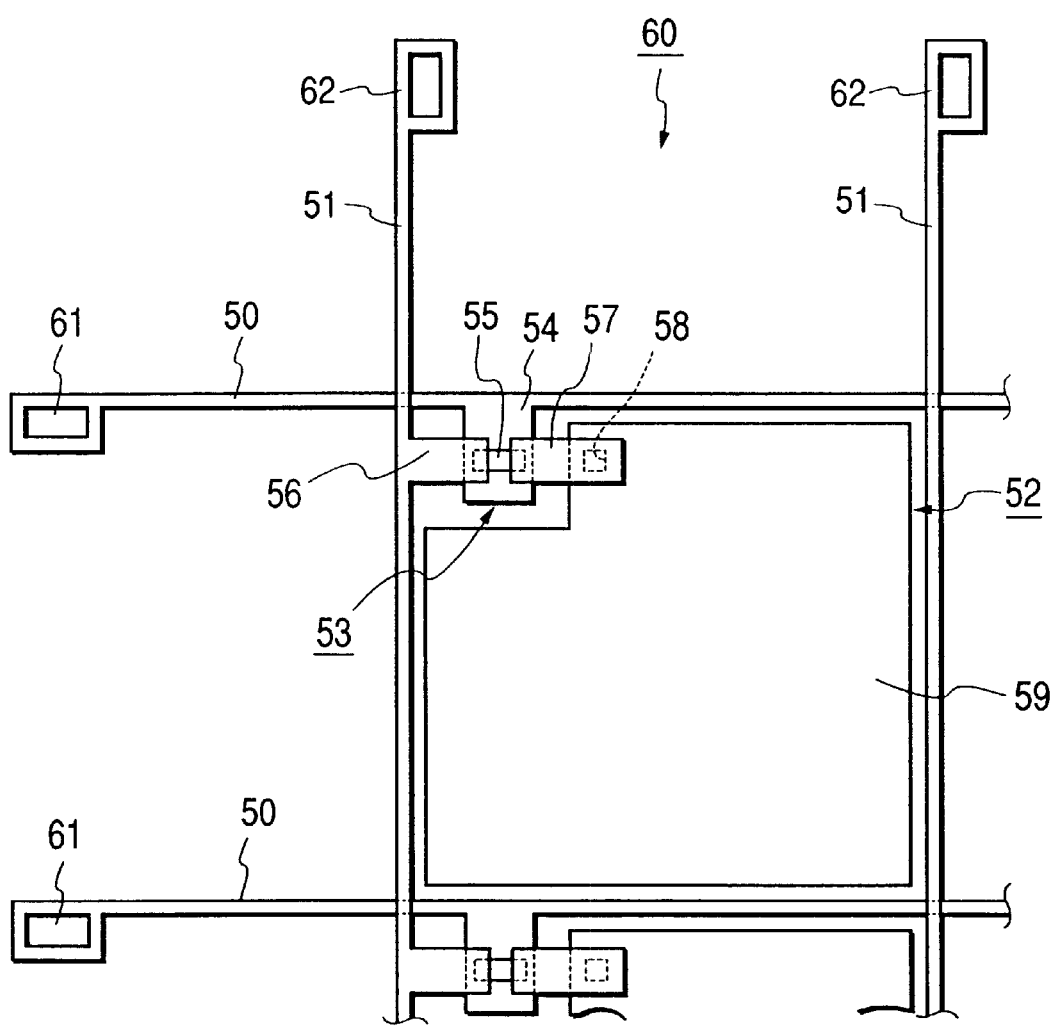
FIG. 7 is a diagram showing a top view of a layout of main components employed in the conventional TFT-array substrate.

On the other hand, FIG. 6 is a diagram showing surface variations in basic I-V characteristic among the TFTs on the conventional TFT-array substrate. As shown in the figure, in the case of the conventional TFT-array substrate with no dummy holes, the surface variations in basic I-V characteristic are pretty big since a difference in electric potential is generated between the source electrode 9 and the drain electrode 10 by electric charge produced by a plasma during a dry-etching process. Traditionally, in order to eliminate adverse effects of a difference in electric potential generated by electric charge produced by a plasma during a dry-etching process on the I-V characteristic of a TFT, an anneal treatment is introduced in any process following the dry-etching process as a countermeasure. However, the structure of the TFT 3 in the TFT-array substrate 1 provided by the present invention can be formed with ease by merely adding a pattern of dummy holes 14 and 15 to a photo mask used for forming contact holes 12. It is thus possible to eliminate adverse effects of electric charge generated by a plasma during a dry-etching process on the I-V characteristic of the TFT 3 without an anneal treatment.

In addition, in the case of the embodiment, the dummy holes 14 and 15 are provided above the gate electrode 6 and the source electrode 9 of each TFT 3 at positions close to the gate wire 18 and the source wire 19 respectively. That is, the TFT 3 is designed by providing the dummy holes 14 and 15 at free spaces of the conventional gate-electrode and source-electrode patterns respectively. Thus, the embodiment offers a merit of no necessity to change the designs of the mask pattern of the conventional gate layer and the mask pattern of the conventional source/drain layer.

Moreover, since the liquid-crystal display device provided by the embodiment employs the TFT-array substrate 1 having small variations in characteristic among TFTs 3 and gate insulation films 7 which are difficult to break, it is possible to implement a liquid-crystal display device exhibiting a uniform picture quality and excellent reliability.

It should be noted that the technological scope of the present invention is not limited to the embodiment described above. That is to say, a variety of changes can be made to the embodiment as long as the changes do not deviate from the gist of the present invention. For example, while the dummy holes 14 and 15 are provided above the gate electrode 6 and the source electrode 9 respectively in the embodiment described above, it is possible to provide only one of the dummy holes 14 and 15. In addition, this single dummy hole does not have to be provided above the gate electrode 6 or the source electrode 9. Instead, the dummy hole can be provided above the gate electrode 6 or above the gate wire 18 as long as the position of the dummy hole is very close to the contact hole above the drain electrode 10.

Furthermore, the embodiment has a structure including ITO upper pad layers electrically connected to lower pad layers each made of a wiring metal through contact holes at the source terminal pad and the gate terminal pad. It should be noted, however, that the upper pad layers are not necessarily required. Instead of providing an upper pad layer, a contact hole for connecting a wire to a driver can be formed.

As described above in detail, according to the present invention, a dummy hole is formed by boring a portion of an insulation film above at least one of a gate electrode, a gate wire, a source electrode and a source wire on the TFT-array substrate provided by the present invention to provide effects of suppressing variations in characteristics among TFTs on the TFT-array substrate to small values and making insulation of gate insulation films difficult to break. Thus, the TFT-array substrate provided by the present invention is capable of solving the problem of the conventional substrate and the present invention is therefore applicable to a substrate with a large size. In addition, in order to eliminate adverse effects of a difference in electric potential generated by electric charge produced by a plasma during a dry-etching process on characteristics of a TFT of the conventional TFT-array substrate, an anneal treatment is introduced in any process following the dry-etching process as a countermeasure. However, the structure of the TFT in the TFT-array substrate provided by the present invention can be created with ease by merely adding a pattern of dummy holes to a photo mask used for forming contact holes. it is thus possible to eliminate adverse effects of electric charge generated by a plasma during a dry-etching process on the I-V characteristic of the TFT without an anneal treatment. Moreover, since the liquid-crystal display device provided by the embodiment employs a TFT-array substrate having small variations in characteristic among TFTs and gate insulation films which are difficult to break, it is possible to implement a liquid-crystal display device exhibiting a uniform picture quality and excellent reliability.

What is claimed is:

1. A thin-film-transistor-array substrate in which:
   a plurality of gate wires and a plurality of source wires are provided on said substrate to form a matrix;
   a pixel is formed on each of a plurality of areas each enclosed by two adjacent ones of said gate wires and two adjacent ones of said source wires;
   said pixel includes a thin-film-transistor having:
      a gate electrode formed as a portion of said gate wire;
      a source electrode formed as a portion of said source wire; and
      a drain electrode connected to a pixel electrode formed on an insulation layer covering said gate electrode, said gate wire, said source electrode and said source wire through a contact hole formed by boring said insulation layer, and
   a dummy hole is formed by boring a portion of said insulation film above at least one of said gate electrode, said gate wire, said source electrode and said source wire in close proximity to said contact hole with said dummy hole reaching said gate electrode, said gate wire, said source electrode or said source wire, respectively.

2. A liquid-crystal display device comprising a liquid crystal sandwiched by a pair of substrates facing each other wherein one of said two substrates is a thin-film-transistor-array substrate according to claim 1.

* * * * *